United States Patent
Rehmeyer et al.

(10) Patent No.: US 11,954,338 B2
(45) Date of Patent: Apr. 9, 2024

(54) SHARED COMPONENTS IN FUSE MATCH LOGIC

(71) Applicant: Micron Technology, Inc., Boise, ID (US)

(72) Inventors: James S. Rehmeyer, Boise, ID (US); Christopher G. Wieduwilt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 17/544,407

(22) Filed: Dec. 7, 2021

(65) Prior Publication Data

US 2023/0176754 A1    Jun. 8, 2023

(51) Int. Cl.
*G11C 7/00*   (2006.01)
*G06F 3/06*   (2006.01)
*G11C 29/44*  (2006.01)

(52) U.S. Cl.
CPC .......... *G06F 3/0626* (2013.01); *G06F 3/0635* (2013.01); *G06F 3/0679* (2013.01); *G11C 29/44* (2013.01)

(58) Field of Classification Search
CPC .... G06F 3/0626; G06F 3/0635; G06F 3/0679; G11C 29/44
USPC .................................................... 365/189.09
See application file for complete search history.

(56) References Cited

U.S. PATENT DOCUMENTS

| | | | | |
|---|---|---|---|---|
| 7,330,383 B2 * | 2/2008 | Takai | ............ | G11C 17/165 365/225.7 |
| 7,573,763 B2 * | 8/2009 | Im | ............ | G11C 29/785 365/201 |
| 7,952,950 B2 * | 5/2011 | Miyatake | ............ | G11C 17/18 365/201 |
| 8,248,871 B2 * | 8/2012 | Park | ............ | G11C 29/785 365/225.7 |
| 8,270,237 B2 * | 9/2012 | Kubouchi | ............ | G11C 17/165 365/201 |
| 8,339,880 B2 * | 12/2012 | Koo | ............ | G11C 29/81 365/201 |

(Continued)

FOREIGN PATENT DOCUMENTS

| | | | | |
|---|---|---|---|---|
| JP | 2001067892 A | * | 3/2001 | |
| TW | 543181 B1 | * | 7/2016 | ........... G11C 11/412 |

*Primary Examiner* — Viet Q Nguyen
(74) *Attorney, Agent, or Firm* — Perkins Coie LLP

(57) ABSTRACT

A memory device includes a memory cell array and a set of fuse banks including a common fuse bank storing common bit information corresponding to a plurality of defective memory cells in the memory cell array. The memory device including a plurality of match sub-circuits corresponding to respective defective memory cells of the plurality of defective memory cells. Each match sub-circuit can be configured to provide a determination of whether a memory cell address of a memory cell of the memory cell array matches an address of the respective defective memory cell. The plurality of match sub-circuit can include a shared common bit-processing circuit that is configured to receive common bit-by-bit results of a comparison between a portion of the memory cell address and the common bit information. The common bit-processing circuit can determine whether the common bit information matches the portion of the memory cell address.

20 Claims, 5 Drawing Sheets

(56) References Cited

U.S. PATENT DOCUMENTS

| | | | | |
|---|---|---|---|---|
| 8,547,762 B2* | 10/2013 | Kim | ............... | G11C 17/14 |
| | | | | 365/201 |
| 8,599,630 B2* | 12/2013 | Song | ............... | G11C 29/806 |
| | | | | 365/225.7 |
| 8,693,270 B2* | 4/2014 | Won | ............... | G11C 29/785 |
| | | | | 365/225.7 |
| 9,036,392 B2* | 5/2015 | Oh | ............... | H03K 19/00392 |
| | | | | 365/96 |
| 9,111,624 B2* | 8/2015 | Fujita | ............... | G11C 11/1653 |
| 9,514,849 B2* | 12/2016 | You | ............... | G11C 29/78 |
| 9,638,229 B2* | 5/2017 | Gamain | ............... | F16B 7/0473 |
| 10,032,525 B2* | 7/2018 | Yang | ............... | G11C 29/76 |
| 10,090,058 B2* | 10/2018 | Chi | ............... | G11C 29/812 |
| 10,403,383 B2* | 9/2019 | Kim | ............... | G11C 29/787 |
| 10,778,226 B1* | 9/2020 | Choi | ............... | G11C 29/842 |
| 10,916,327 B1* | 2/2021 | He | ............... | G11C 29/50 |
| 11,328,787 B2* | 5/2022 | Jung | ............... | G11C 17/18 |
| 11,557,367 B2* | 1/2023 | Wieduwilt | ............... | G11C 29/028 |
| 11,669,447 B2* | 6/2023 | Wieduwilt | ............... | G11C 29/84 |
| | | | | 365/225.7 |
| 2014/0169059 A1* | 6/2014 | Kong | ............... | G11C 29/785 |
| | | | | 365/96 |

* cited by examiner

SHARED COMPONENTS IN FUSE MATCH LOGIC

TECHNICAL FIELD

The disclosed embodiments relate to memory devices. More particularly, this invention relates to memory devices that use fewer circuit components in memory repair circuits while maintaining the same memory redundancy.

BACKGROUND

A memory device can include a semiconductor substrate with one or more memory cell arrays and supporting logic circuits located on the peripheral area adjacent the memory cell arrays. The logic circuits can include, for example, control and addressing circuits, line driver circuits, sense amplifier circuits, and other supporting circuitry for operating and communicating with the memory cell arrays. The logic circuits can also include memory repair circuits for repairing memory cells that have been damaged. Many approaches have been used to increase memory density and/or array efficiency in a memory device. Memory density is the number of bits that can be stored in memory on a die. Array efficiency can be defined as the percentage of the semiconductor substrate area of the memory device that includes the memory cell arrays. One way to increase memory density and/or array efficiency is to make the memory devices smaller. Another way is to reduce the number of circuit components required to implement the same memory capacity. For example, if one hundred circuit components can be interconnected to provide the same memory capacity as one hundred and fifty similarly sized circuit components, memory density is increased (because less area on the die is used, which allows for more memory capacity).

In view of the foregoing, it would be desirable to be able to provide memory repair circuits that reduce the number of components (e.g., fewer gates and/or fewer transistors in logic gates, for example, NAND, XNOR, NOR, etc.) on a memory die while maintaining the same memory redundancy.

DETAILED DESCRIPTION

Figure 1A:
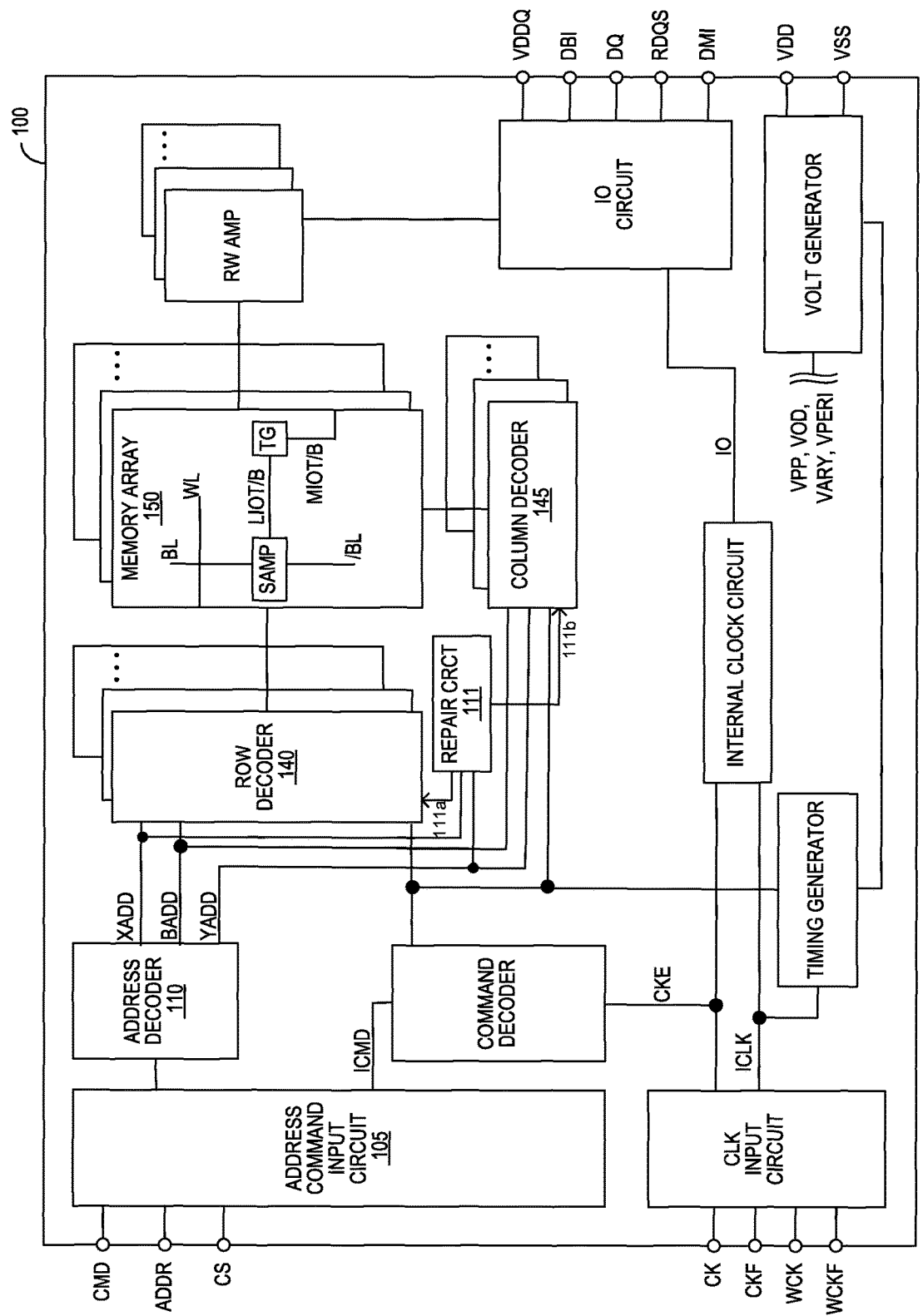
FIG. 1A is a block diagram of an example memory device in accordance with an embodiment of the present technology.

Memory devices (e.g., random-access memory (RAM), such as dynamic RAMs (DRAMs), including 3-D RAM and DRAM) typically include one or more arrays of memory cells, which store data, on a substrate (e.g., of a die). Some memory devices can include circuits configured to repair damaged memory cells and typically include a plurality of memory cells and redundant memory cells (e.g., spare rows and/or columns). Memory devices are tested for damaged rows and columns, for example, prior to shipping to a customer. The memory device can include one or more redundancy structures for storing addresses of damaged memory cells. If a portion of a primary row or column is damaged (e.g., damaged memory cell), a redundant row or column can be used to replace the damaged row or column. This is known as "repairing." When a redundant row or column is used, the memory device is "programmed" to access a redundant (or replacement) memory cell of that row or column instead of the original or primary cell of the damaged row or column.

One way to program which memory cells are accessed is by using fusible links (fuses), anti-fuses, latches such as, e.g., dual integrated storage cell latch (DICE), and/or or other types of non-volatile memory. Fuses are integrated circuit components that are designed to break (or burn) when a relatively high current is selectively applied. This severs the connection between two points. Alternatively, "anti-fuses" are designed to connect two points. For clarity, embodiments of the present disclosure are discussed in terms of fuses, but those skilled in the art understand that the description is applicable to embodiments that use any combination of fuses, anti-fuses, latches such as, e.g., DICE, and/or or other types of non-volatile memory. Memory cell programming usually occurs before the memory device is shipped to a customer. A test circuit and/or a testing sequence accessing memory bits can determine which memory cells, if any, have electrical issues—that is, which memory cells are damaged (also referred to herein as "defective"). The addresses of damaged memory cells are programmed into "fuse banks," and the memory device can have an array of fuse banks stored in an area of the memory device. Each bit of the damaged memory address correspond to a fuse in the fuse bank. The addresses in the fuse banks can correspond to damaged row addresses and/or damaged column addresses. If, during operation of the memory device, the address (e.g., row address and/or column address) for the memory cell being accessed (e.g., to perform memory operations such as read, write, etc.) matches a damaged address programmed in the fuse bank, logic is set up such that the access to the damaged cell is redirected to a replacement (also referred to herein as "redundant") memory cell.

To provide full redundancy in a memory device using fuses, the number of fuses should equal the number of bits used to address the memory cell. Additionally, the bit compare circuit that compares the bits of the received memory address to the bits of the damaged memory address in the fuse bank can include an equal number of XNOR gates that are used for the comparison. For example, if a seven-bit address is used to address a memory cell, then seven fuses and seven XNOR gates are required to provide full redundancy. However, fuses and XNOR gates consume large amounts of area on a memory device and thus adversely impact memory density and/or array efficiency. Attempts have been made to reduce the number of fuses and XNOR gates while maintaining substantially the same degree of memory redundancy. For example, in some related art systems, fuses have been shared to reduce the number of fuses while substantially maintaining the same degree of memory redundancy. Fuse sharing takes advantage of the fact that, when storing multiple addresses (e.g., fuse banks) on a redundancy structure, the same bit value for two or more addresses often occurs in the same bit position. For example, a logic value 1 may be the least significant bit (LSB) in two addresses (e.g., 00001 and 11111). Of course, more than one bit (e.g., LSB) can be shared, for example, up to one less than the total number of bits in an address can be shared. Thus, by sharing one or more LSBs, the number of fuses and circuit components required to store addresses can be reduced, while maintaining substantially the same redundancy (and ultimately usable capacity). However, while fuse sharing, which corresponds to individual bits, can provide some reduction in the periphery area, in conventional memory devices, the circuit that determines if there is a match between an address stored in the fuse bank(s) with the address of the memory cell being accessed does not include shared logic components. Thus, further reduction in the peripheral area is achievable.

In exemplary embodiment of the present disclosure, one or more components in a match circuit portion of the repair circuit are shared in order to provide a reduction in the peripheral logic area for the repair circuit area and/or fuse bank area. Thus, exemplary embodiments of the present disclosure provide further reductions in the periphery logic area, and in some exemplary embodiments, the power consumption of the memory device can be reduced due to sharing of circuitry. In accordance with exemplary embodiments a memory device can include a memory cell array with a plurality of memory cells and a plurality of replacement cells. The memory device can also include a set of fuse banks for storing bit information related to addresses of defective memory cells. The set of fuse banks can include one or more fuse banks that are common fuse banks in that the common fuse banks store bit information that is common to two or more defective memory cells in the memory cell array. In some embodiments, the memory device can include a repair circuit that is operatively coupled (or connected) to the memory cell array and/or the set of fuse banks. The repair circuit can include two or more match sub-circuits with each match sub-circuit corresponding to a respective defective memory cell. Each match sub-circuit can be configured to provide a determination of whether a memory cell address used for memory operations on a memory cell of the memory cell array matches an address of the respective defective memory cell. In some embodiments, the two or more match sub-circuit include a shared common bit-processing circuit that is configured to receive common bit-by-bit results. That is, one common bit-processing circuit can be shared between two or more match sub-circuits. The common bit-by-bit results are based on a comparison between a portion of the memory cell address and the common bit information. In some embodiments, the common bit-processing circuit can be configured to determine whether the common bit information matches the portion of the memory cell address.

In another embodiment, a method includes storing common bit information corresponding to two or more defective memory cells of a memory array. The method can further include providing a determination of whether a memory cell address used for memory operations on a memory cell of the memory array matches an address of a defective memory cell. The method also includes receiving common bit-by-bit results based on a comparison between a portion of the memory cell address and the common bit information and determining whether the common bit information matches the portion of the memory cell address.

FIG. 1A is a block diagram of an example memory device 100 in accordance with an embodiment of the present technology. For example, the memory device 100 can include a DRAM or a portion thereof that includes one or more dies/chips. The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100; although in other embodiments, the host device may be indirectly connected to memory device (e.g., over a networked connection or through intermediary devices).

The memory device 100 can include an array of memory cells, such as memory array 150. The memory array 150 may include a plurality of banks, and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145.

The command terminals and address terminals may be supplied with an address signal and a bank address signal (not shown) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145. The received addresses (e.g., row addresses, column addresses, etc.) can relate to memory operations (e.g., read, write, etc.) on a memory cell in memory array 150. Memory device operation is known to those skilled in the art and thus, for brevity, a detailed description is omitted except as needed to describe embodiments of the present disclosure.

The memory device 100 can include memory repair circuits such as, for example, repair circuit 111, which can be coupled to one or more address decoders, such as the address decoder 110, the row decoder 140, and/or the column decoder 145. For example, the repair circuit 111 can receive the row address XADD and/or the column address YADD, which can correspond to addresses received from an external system and/or generated internally (e.g., during a refresh procedure). The received XADD and/or YADD addresses can be respectively compared to known defective addresses. If there is a match, the repair circuit 111 can be configured to repair defects in storage cells. For example, a corresponding signal 111a or 111b can be sent to the respective row decoder 140 or the column decoder 145 to use redundant memory rows and/or columns instead of the main (or normal) rows and/or columns. That is, the repair circuit 111 can send the appropriate signals to replace defective memory cells with redundant memory cells in the memory array 150. As described in further detail below, the repair circuit 111 can include and/or be operatively connected to fuse banks that are configured to store information (e.g., bit information). In some embodiments, the stored information can be bit information of addresses and/or portions of addresses (e.g., row addresses and/or column addresses) associated with defective memory cells. In some embodiments, the bit information are programmed into fuse banks using fuses, latches such as, e.g., DICE, anti-fuses, and/or other types of non-volatile memory. In FIG. 1A, the repair circuit 111 is shown connected to both the row decoder 140 and the column decoder 145. However, in other embodiments, the memory device 100 can include separate row repair and column repair circuit.

Figure 1B:
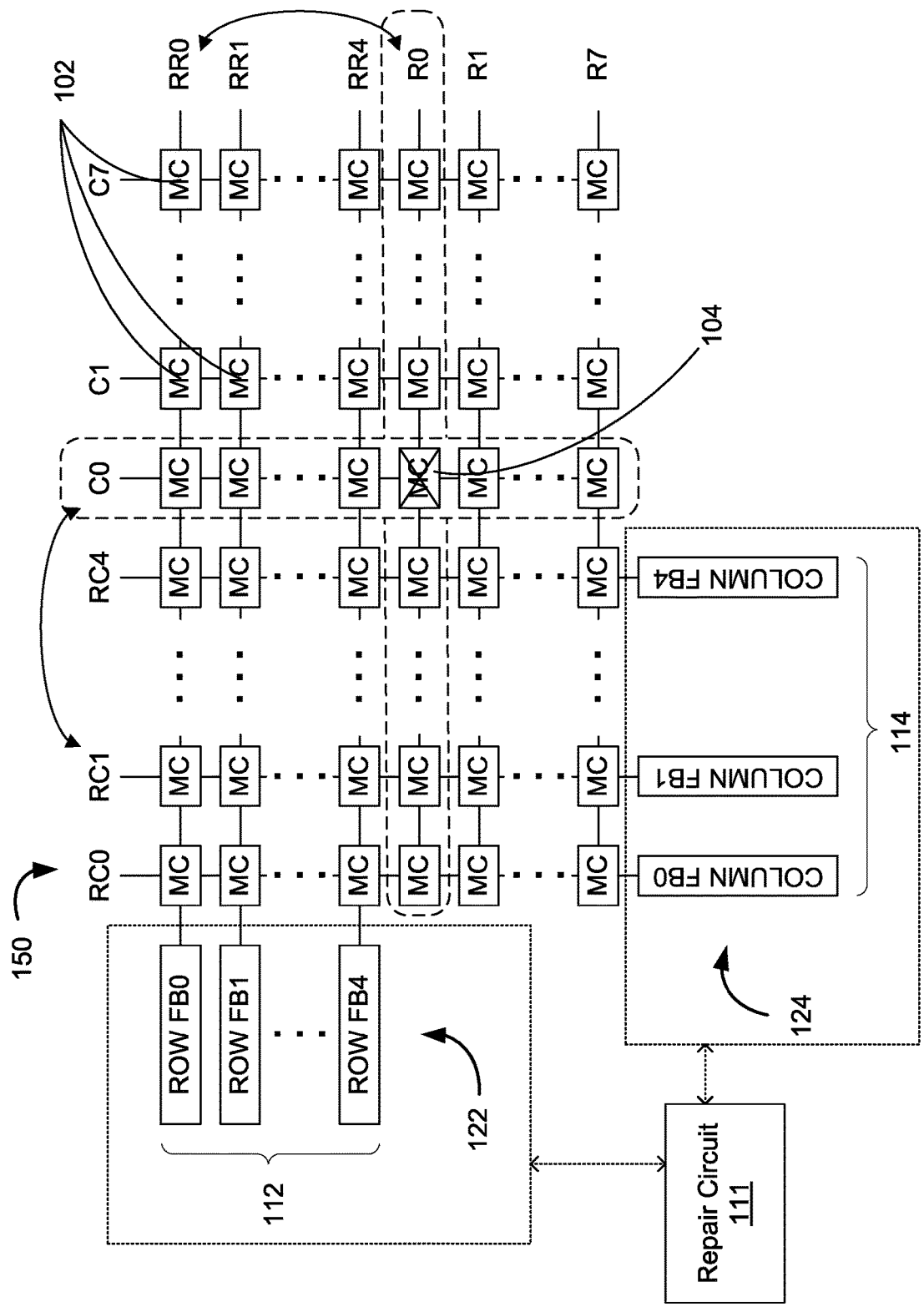
FIG. 1B is a partial block diagram of a memory device including a set of repairable memory cells.

FIG. 1B is a partial block diagram of the memory device 100 showing a portion of the memory array 150 and repair circuit 111. As seen in FIG. 1B memory array 150 can be configured so as to be repairable. The memory device 100 includes repair circuit 111 coupled to and/or integral with memory cells 102 and configured to repair/replace one or more defective cells 104 within the corresponding set of memory cells 102. The memory cells 102 include repair or redundant cells that are designated to replace the defective cells 104 based on the logic in repair circuit 111. In other words, the redundant cells are configured to be back up memory cells that are not utilized in normal operations unless they are used to replace actual/main memory cells 102 that have become faulty. The redundant cells are arranged in rows and columns (as, e.g., redundant rows 112 and redundant columns 114) similarly to the other memory cells 102.

In replacing the defective cells 104, the memory device 100 may implement row repairs and/or column repairs. For row repairs, the memory device 100 may deploy and utilize the redundant rows 112 to replace rows including the defective cells 104. As illustrated in FIG. 1B, the memory device 100 may replace row R0, which contains the defective cell 104 therein, with a redundant row RR0. For column repairs, the memory device 100 may deploy and utilize the redundant columns 114 to replace columns including the defective cells 104. As illustrated in FIG. 1, the memory device 100 may replace column C0, which contains the defective cell 104 therein, with a redundant column RC1.

The repair circuit 111 can include fuse banks and/or be coupled to separately located fuse banks with circuitry configured to facilitate the memory cell replacements. Each of the fuse banks can include a set of fuses, anti-fuses, latches such as, e.g., DICE, and/or or other types of non-volatile memory. The repair circuit 111 can be coupled (e.g., directly or statically in a one-to-one dedicated and fixed electrical and functional connection) to a redundant row or a redundant column. As illustrated in FIG. 1B, the fuse banks can include row fuse banks 122 that are each directly coupled to one of the redundant rows 112 and column fuse banks 124 that are each directly coupled to one of the redundant columns 114. Each fuse bank is configured to store addresses of the row/column of defective cells, including the defective cell 104. For example, when a redundant column/row is used to replace a defective column/row, the fuse bank for the corresponding redundant column/row can be programmed (via, e.g., blowing/setting the fuses therein) to store the address of the defective column/row (dashed outline around column/row). The defective column/row can be effectively removed from operations of the memory device 100. Subsequently, the redundant column/row is used to store and provide access to data in place of the replaced defective column/row. For clarity, embodiments of the present disclosure may be described with respect to repair of individual memory cells. However, those skilled in the art understand that the repair of defective memory cells means using the redundant column and/or row associated with the defective memory cell instead of its normal column and/or row.

Figure 2A:
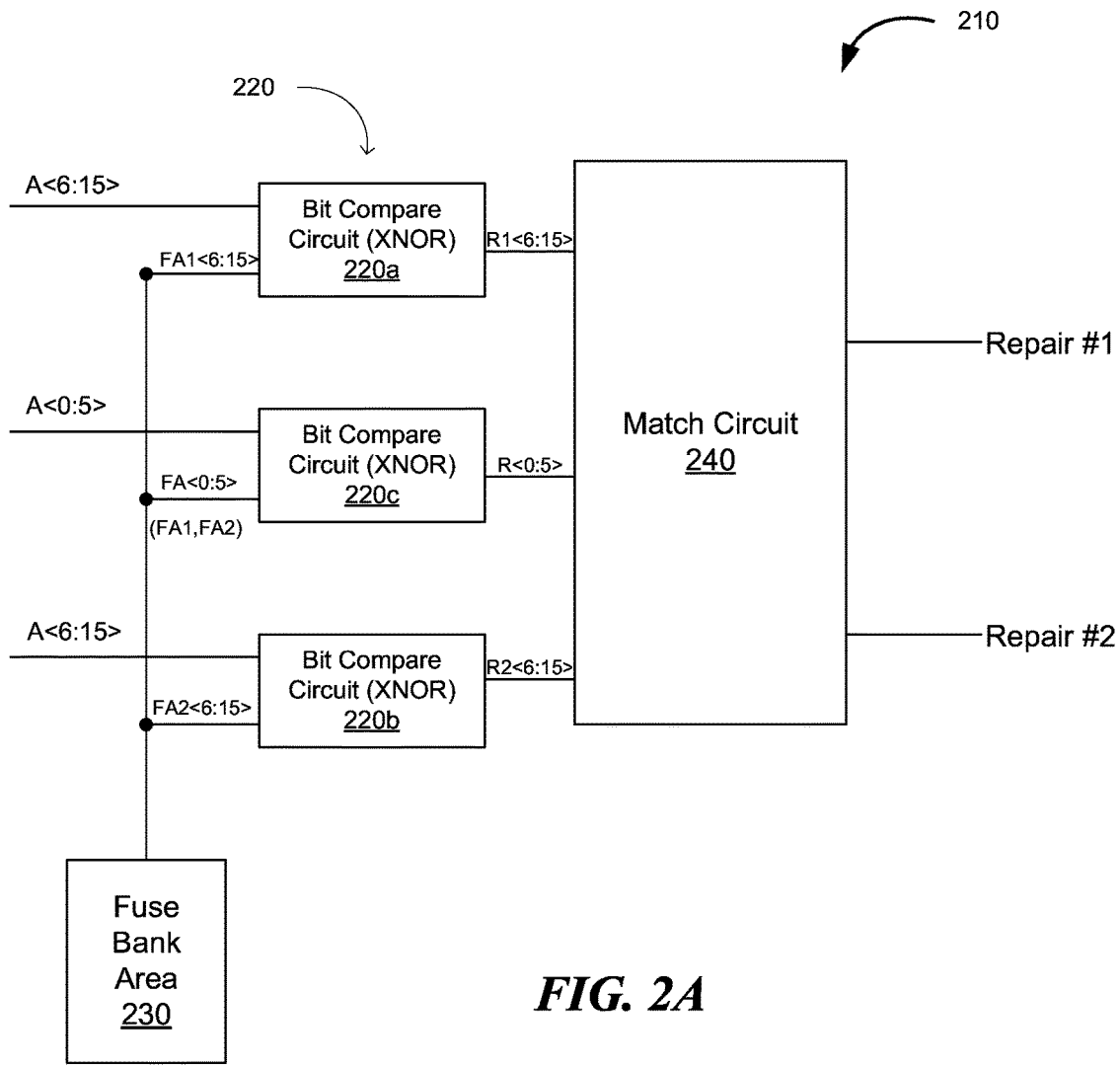
FIG. 2A is a block diagram of a portion of a repair circuit and fuse bank that is in accordance with an embodiment of the present technology.

FIG. 2A illustrates an exemplary compare circuit assembly 210 that can be, for example, part of repair circuit 111. The compare circuit assembly 210 can facilitate repairs of one or more damaged memory cells in accordance with an embodiment of the present disclosure. In the illustrated example, compare circuit assembly 210 includes logic circuitry for repairing two damaged memory rows and/or memory columns. However, in other embodiments, compare circuit assembly can include any number of repair circuits.

In some embodiments, the compare circuit assembly 210 includes one or more bit compare circuits 220. The bit compare circuits 220 receive memory addresses such as, for example, memory cell address A, which correspond to an address (e.g., row address and/or column address) for memory operations (e.g., read, write, etc.) on a memory cell 102 in memory array 150. Because memory cell address A can potentially correspond to a defective memory cell (or to a row or column having one or more defective memory cells), a check can be performed and, if defective, the memory cell can be repaired/replaced. The memory cell address A is transmitted to the bit compare circuits 220 from an external system and/or generated internally (e.g., during a refresh procedure). The bit compare circuits 220 can receive bit information corresponding to damaged memory cells stored in fuse banks located in fuse bank area 230, which can be part of the repair circuit 111 or located separately. The bit information of the fuse banks can be an addresses FA (e.g., FA1, FA2) or a portion of the address FA of the damaged memory cells that is programmed into fuses, anti-fuses, latches such as, e.g., DICE, and/or or other types of non-volatile memory of the fuse bank. The bit compare circuits 220 can perform a bit-by-bit comparison (e.g., via XNOR logic) between bits of the memory cell address A with corresponding bit information of the fuse bank (e.g., FA1, FA2, etc.) to determine if the respective bit value is the same. The results R (e.g., R1, R2, etc.) of the bit-by-bit comparisons are then input to match circuit 240. The results R are then compared by the match circuit 240 to determine if the memory cell address A matches the fuse bank addresses FA. If so, a repair signal is output (e.g., Repair #1 or Repair #2) to indicate that the memory cell at memory cell address A is defective and the corresponding redundant memory cell should be accessed instead.

Figure 2B:
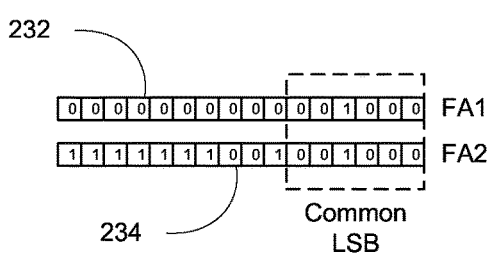
FIG. 2B is a block diagram of a fuse bank used in explaining a feature of an embodiment of the present technology.
Figure 2C:
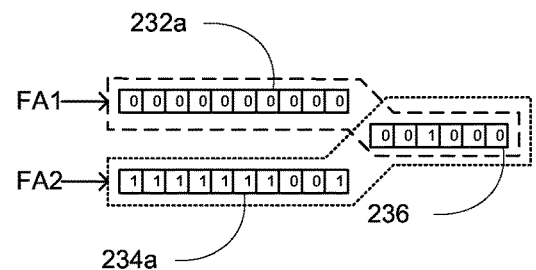
FIG. 2C is a block diagram of a fuse bank in accordance with an embodiment of the present technology.

In some embodiments, as discussed above, when portions of fuse bank addresses have bit values (e.g., consecutive LSB bits) that are the same, a reduction in the fuse circuits and sharing of bit compare logic is possible when comparing a memory address A to two or more fuse addresses FA. That is, a reduction in the fuse bank area 230 and/or the logic area of the bit compare circuits 220 can be achieved if fuse bank addresses FA1 and FA2 have LSB portions that are the same. For example, FIG. 2B illustrates two fuse banks 232 and 234 storing corresponding addresses FA1 and FA2, which are each 16-bit addresses (e.g., FA1<0:15> and FA2<0:15>). The fuse bank addresses FA1 and FA2 have 6 LSB bits (box with dotted outline) with respective values that are the same. In such cases, the common LSB portion of the fuse banks 232 and 234 can be shared such that the common LSB portion is only programmed once in the fuse bank area 230 (e.g., as a common fuse bank having bit information that is common to two or more defective memory cells). For example, as seen in FIG. 2C, the fuse bank area 230 can include a fuse bank 232a storing a non-common address portion (e.g., 10 most significant bits (MSBs)) of FA1<6:15> and fuse bank 234b storing a non-common address portion (e.g., 10 MSBs) of FA2<6:15> and fuse bank 236 storing a common address portion of (e.g., 10 MSB bits) of both FA1<0:5> and FA2<0:5> and referred to herein as FA<0:5>. The complete address for FA1 is a combination of the bit information in fuse banks 232a and 236 as shown by the dashed outline box, and the complete address for FA2 is a combination of the bit information in fuse banks 234a and 236 as shown by the dotted outline box. In exemplary embodiments, a common fuse bank (e.g., fuse bank 236) can store bit information corresponding to X LSBs that are common to two or more defective memory cells, where X is an integer greater than zero and less than a total number of address bits of a defective memory cell. For example, for a 16-bit address, the common fuse bank can store 1 common LSB to 15 common LSBs, depending on how many LSBs the defective memory cells have in common. As indicated above, the fuse banks 232a, 234a, and/or 236 can store portions of addresses that correspond to, for example, row address and/or column address.

In exemplary embodiments of the present disclosure, bit-by-bit comparisons can be performed between a memory cell address and addresses stored in two or more fuse banks, including at least one common address portion stored in a shared or common fuse bank. The bit-by-bit comparison circuits 220 can include two or more bit compare circuits (e.g., 220a, 220b) that perform bit-by-bit comparisons of the memory cell address A with just the non-common address portions stored in two or more fuse banks (e.g., 232a, 234a) and one or more bit compare circuits (e.g., 220c) that perform bit-by-bit comparisons of the memory cell address A with just a common address portion stored in one or more fuse banks (e.g., 236). For example, as seen in FIG. 2A, the comparison circuits 220 can be configured such that the bit-by-bit comparison of the memory cell address A to the fuse bank addresses FA1 and FA2 do not duplicate the bit-by-bit comparisons of the common LSBs of fuse bank addresses FA1 and FA2. For example, as seen in FIG. 2A, the bit comparisons circuits 220 can include bit comparison circuit 220a for performing a bit-by-bit comparison of memory cell address A (e.g., A<6:15>) with the non-common portion of fuse address FA1 (e.g., FA1<6:15>), bit comparison circuit 220b for performing a bit-by-bit comparison of memory cell address A (e.g., A<6:15>) with the non-common portion of fuse address FA2 (e.g., FA2<6:15>), and bit comparison circuit 220c for performing a bit-by-bit comparison of memory cell address A (e.g., A<0:5>) with the common portion of fuse addresses FA1 and FA2 (e.g., FA<0:5>). The results R of the bit-by-bit comparisons (e.g., R1<6:15>, R<0,5>, and R2<6:15>) are transmitted to match circuit 240 to determine if the memory address A matches either fuse address FA1 or fuse address FA2. The exemplary embodiment of FIG. 2A relates to the repair of two defective memory cells. However, a typical memory device can have thousands of such circuits. By storing common portions of two or more defective addresses in a shared or common fuse bank, the bit compare circuits 220 can have less components (e.g., less XNOR gates) and thus use less logic area in the peripheral area of the memory device.

As discussed above, the results R of the bit-by-bit comparisons are sent to the match circuit 240 to determine if the memory address A corresponds to an address that includes a defective memory cell. If the comparison results in a match (memory cell address A corresponds to a defective memory cell address FA), the match circuit 240 outputs a repair signal on the corresponding signal line (e.g., Repair #1 or Repair #2) to perform a repair (e.g., direct the memory operation to the redundant memory cell instead of the original memory cell, for example, by selecting the redundant row and/or column as discussed above). Conversely, if the comparison does not result in a match (memory address A does not correspond to a defective memory cell address FA), the match circuit 240 outputs a signal on the corresponding signal line (e.g., Repair #1 or Repair #2) to direct the memory operation to the original memory cell, for example, by selecting the primary row and/or column as discussed above.

Figure 4:
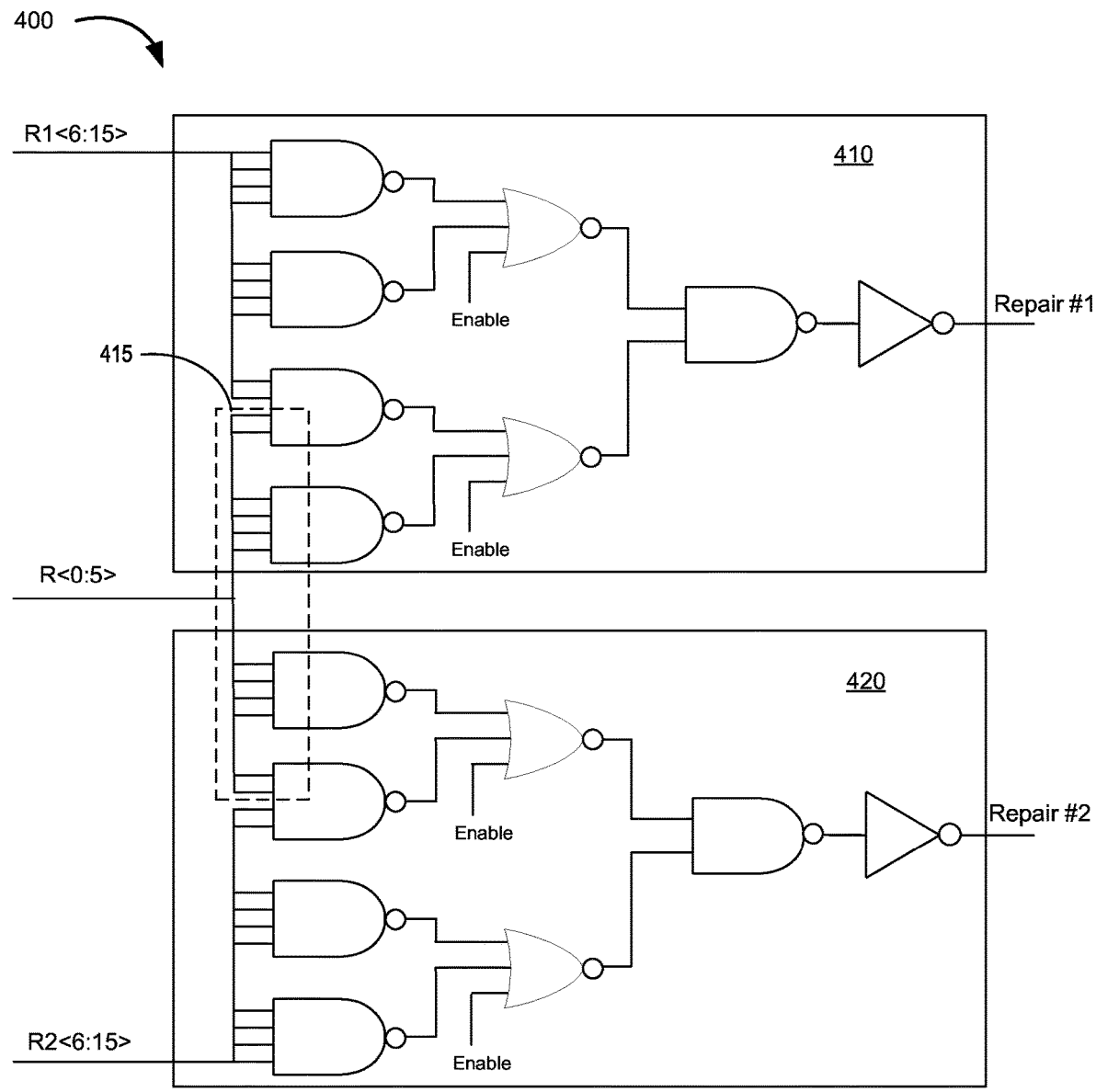
FIG. 4 is a block diagram of a related art match circuit.

In conventional match circuits, the results of the comparison between A and FA1 (e.g., R<0:5> and R1<6:15>) and the results of the comparison between A and FA2 (e.g., R<0:5> and R2<6:15>) are separately processed. This means that the results for the common portions (e.g., R<0:5>) of the fuse bank addresses FA1 and FA2 are processed twice using separate circuits. For example, FIG. 4 illustrates a portion of a related art match circuit 400 having two match sub-circuits 410 and 420. As seen in FIG. 4, in conventional match circuits, all 16-bits of the result (e.g., R<0:5> and R1<6:15>) between addresses A and FA1 are processed by match sub-circuit 410 and all 16-bits of the result (e.g., R<0:5> and R2<6:15>) between addresses A and FA2 are processed by match sub-circuit 420. However, by separately processing the bit-comparison results of address A and FA1 and the bit comparison results of address A and FA2, match circuit 400 does not take advantage of the common bit comparison results (e.g., R<0:5>). That is, the processing of the bit comparisons for R<0:5> occurring in the region 415 (dotted box) are duplicated using separate circuits in respective match sub-circuits 410 and 420. In the circuit of FIG. 4, two sets of 4-input NAND logic (one set in each repair match circuit) are used to process the six common bit results. In exemplary embodiments of the present disclosure, the common bit comparison result (e.g., R<0:5>) is processed once using bit-processing circuits that are common to more than one match sub-circuit. Thus, exemplary embodiment of the present disclosure take up less peripheral logic area than conventional match circuits.

In exemplary embodiments of the present disclosure, a match circuit (e.g., match circuit 240 of repair circuit 111) can include two or more match sub-circuits with each match sub-circuit corresponding to a respective defective memory cell. Each match sub-circuit is configured to provide a determination of whether a memory cell address used for memory operations on a memory cell of the memory cell array corresponds to the respective defective memory cell. In some embodiments, the two or more match sub-circuits include a shared common bit-processing circuit that is configured to receive common bit-by-bit results corresponding to a common fuse bank. That is, one common bit-processing circuit is shared between two or more match sub-circuits. The common bit-by-bit results are based on a comparison between a portion of the memory cell address and the common bit information. In some embodiments, the common bit-processing sub-circuit can be configured to determine whether the common bit information matches the portion of the memory cell address.

Figure 3:
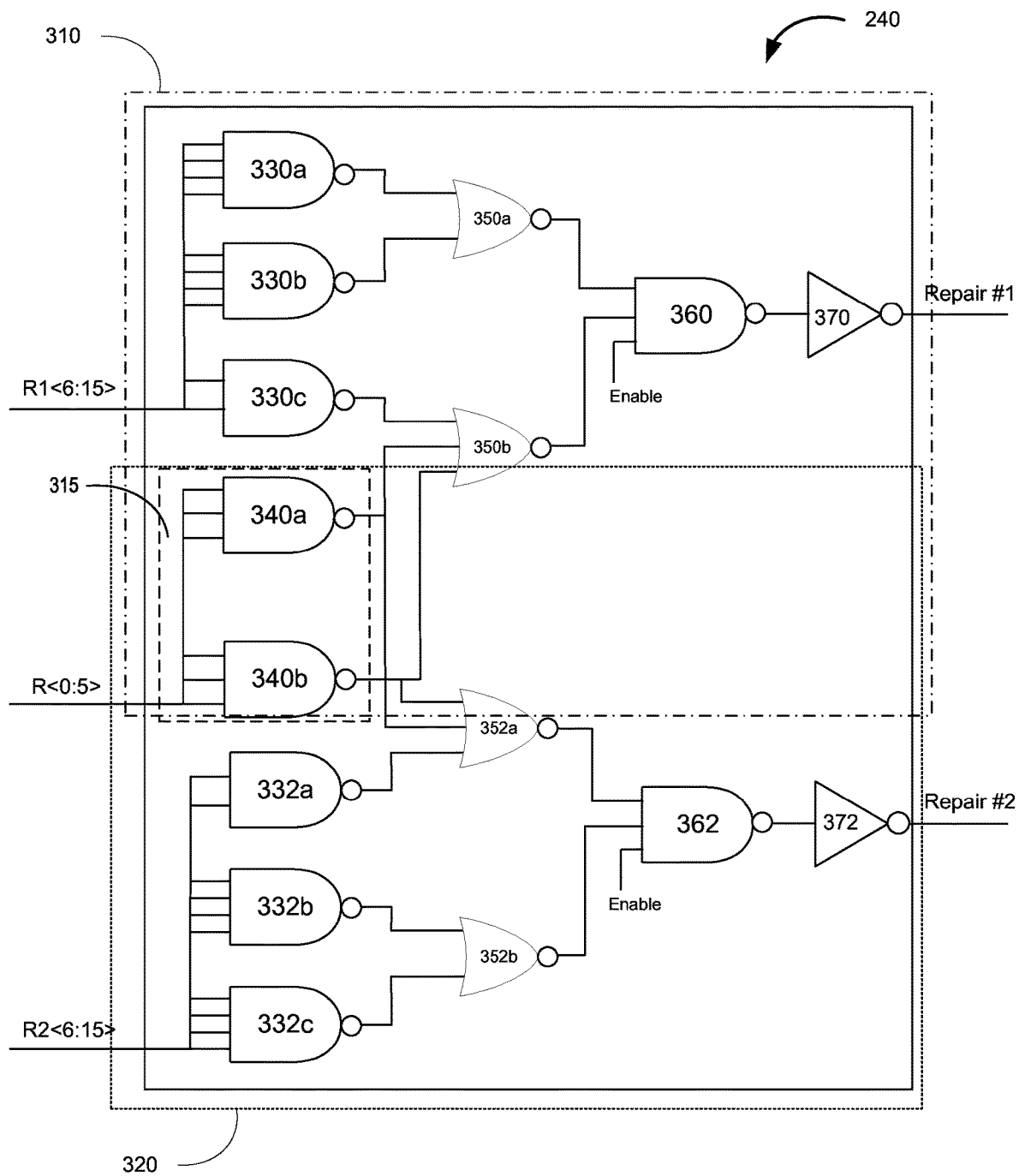
FIG. 3 is a block diagram of a match circuit of a repair circuit in accordance with an embodiment of the present technology.

For example, FIG. 3 illustrates an embodiment of match circuit 240 that is consistent with an embodiment of the present disclosure. The match circuit 240 includes two match sub-circuits 310 and 320 that output repair signals (e.g., Repair #1 and Repair #2, respectively) based on the bit comparison results (e.g., R, R1, R2). The match circuit 240 includes NAND gates 330*a-c*, and 360, NOR gates 350*a,b*, and inverter 370 that are exclusive to match sub-circuit 310 (e.g., not shared with match sub-circuit 320) and includes NAND gates 332*a-c*, and 362, NOR gates 352*a,b*, and inverter 372 that are exclusive to match sub-circuit 320 (e.g., not shared with match sub-circuit 310). In addition, match circuit 240 includes a common bit-comparison circuit 315 (e.g., NAND gates 340*a,b*) that are shared by or common to both match sub-circuits 310 and 320. In the exemplary embodiment of FIG. 3, bit comparison results R, R1, R2 from the bit comparison circuits 220 are received as inputs to corresponding NAND gates. For example, for match sub-circuit 310, the ten result bits R1<6:15> from bit comparison circuit 220*a* are received by two 4-input NAND gates 330*a* and 330*b* and a 2-input NAND gate 330*c*, and the 6 result bit R<0:5> (corresponding to the common bit information) are received by two 3-input NAND gates 340*a* and 340*b*. The NAND gates 330*a-c* and 340*a,b* compare the respective bit comparison inputs R and R1 and output respective signals based on the received inputs. In this exemplary embodiment, the outputs of the NAND gates 330*a-c* and 340*a,b* are received by a 2-input NOR gate 350*a* and a 3-input NOR gate 350*b*, which compare the respective inputs and output corresponding signals. The outputs of the NOR gates 350*a,b* are received by a 3-input NAND gate 360, which compares the inputs and outputs a signal based on the inputs. Two of the inputs to the NAND gate 360 correspond to the outputs of the NOR gates 350*a,b* and the third input can receive an enable/disable signal. The enable/disable signal can be used to enable or disable the match sub-circuit 310 when desired such as, for example, when diagnostics and/or other testing is being performed on the memory device. The output of the NAND gate 360 is inverted by inverter 370 and then output as a repair signal (e.g., Repair #1). Thus, in the exemplary match sub-circuit 310, if the bit comparison results R<0:5> and R1<6:15> are all "1s" or "ON" indicating that the each bit of memory cell address A matches the respective bit of fuse address FA1 (both the common and non-common portions), the output repair signal Repair #1 has a value of "1" indicating that a repair needs to be performed on the corresponding memory cell (e.g., a repair signal to direct the memory operation to the redundant memory cell instead of the original memory cell, for example, by selecting the redundant row and/or column as discussed above). The logic of match sub-circuit 320 is similar to that of match sub-circuit 310. Thus, for brevity a detailed description is omitted. Similar to match sub-circuit 310, if the bit comparison results R<0:5> and R2<6:15> are all "1s" or "ON" indicating that the each bit of memory address A matches the respective bit of fuse address FA2 (both the common and non-common portions), the output repair signal Repair #2 has a value of "1" indicating that a repair needs to be performed on the corresponding memory cell (e.g., a repair signal to direct the memory operation to the redundant memory cell instead of the original memory cell, for example, by selecting the redundant row and/or column as discussed above).

As seen in FIG. 3, match sub-circuit 240 includes a bit-processing circuit 315 (e.g., NAND gates 350*a* and 350*b*) that receives and processes the bit-by-bit results (e.g., R<0:5>) corresponding to bit information stored in a common fuse bank 236 (e.g., FA<0:5>). In exemplary embodiments of the present disclosure, the bit-processing circuit 315 is shared or common to both match sub-circuit 310 and match sub-circuit 320. That is, unlike conventional match circuits, the processing of the common bit comparison results is not duplicated, which can mean a reduction in the peripheral logic area. For example, in the example of FIG. 3, because the bit-processing circuits for the 6 common results R<0:5> can be shared, there can be reduction in the gates required for processing. When taking into account that there are thousands of repair circuits in a memory device (e.g., with thousands of fuse banks that can store bit information that is common to two or more defective cells), the reduction in the logic area corresponding to the match circuits of a repair circuit can be in a range of 10% to 25%. For example, the match circuit 400 of FIG. 4, which does not share circuits, can include 100 gates. In contrast, the match circuit 240 of FIG. 3, which shares bit-processing circuit 315, can include 12% less transistors and thus requires less logic area, because some of the NAND gates have less transistors. Another advantage of the exemplary embodiments of the present disclosure is that the repair circuits use less power due to reduced switching and/or leakage because of the shared circuitry. That is, any reduction in the number of transistors will mean a reduction in power usage. Accordingly, exemplary embodiments of the present disclosure can provide patentable advantages regardless of whether there is an actual percentage reduction in the logic area. Of course, the logic configuration of match circuit 240 discussed above is exemplary and other logic configurations/gates can be used in exemplary embodiments of the present disclosure so long as the logic to process the common bit comparison results is shared by two or more match sub-circuits.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc. The above embodiments are described in sufficient detail to enable those skilled in the art to make and use the embodiments. A person skilled in the relevant art, however, will understand that the technology may have additional embodiments and that the technology may be practiced without several of the details of the embodiments described above.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device, comprising:
   a memory cell array;
   a set of fuse banks including a common fuse bank storing common bit information corresponding to a plurality of defective memory cells in the memory cell array; and
   a repair circuit including a plurality of match sub-circuits corresponding to respective defective memory cells of the plurality of defective memory cells, each match sub-circuit configured to provide a determination of whether a memory cell address of a memory cell of the memory cell array matches an address of the respective defective memory cell,
   wherein the plurality of match sub-circuits include a shared common bit-processing circuit that is configured to receive common bit-by-bit results of a comparison between a portion of the memory cell address and the common bit information and determine whether the common bit information matches the portion of the memory cell address.

2. The memory device of claim 1, wherein the plurality of defective memory cells includes a first defective memory cell and a second defective memory cell, and
   wherein the plurality of match sub-circuits includes a first match sub-circuit to provide a first determination of whether the memory cell address matches a first address of the first defective memory cell and a second match sub-circuit to provide a second determination of whether the memory cell address matches a second address of the second defective memory cell.

3. The memory device of claim 2, wherein the common bit information corresponds to X least significant bits (LSBs) of the first address and the second address, where X is an integer greater than zero and less than a total number of address bits of the first defective memory cell or the second defective memory cell.

4. The memory device of claim 2, wherein the set of fuse banks further includes a first fuse bank storing first bit information corresponding to the first defective memory cell, and a second fuse bank storing second bit information corresponding to the second defective memory cell.

5. The memory device of claim 4, wherein the repair circuit includes a bit compare circuit configured to generate the common bit-by-bit results, first bit-by-bit results based on a comparison between a first portion of the memory cell address and the first bit information, and second bit-by-bit results based on a comparison between the first portion of the memory cell address and the second bit information.

6. The memory device of claim 5, wherein the first match sub-circuit includes a first bit-processing circuit that is exclusive to the first match sub-circuit and configured to process the first bit-by-bit results, and
   wherein the second match sub-circuit includes a second bit-processing circuit that is exclusive to the second match sub-circuit and configured to process the second bit-by-bit results.

7. The memory device of claim 4, wherein the common bit information and the first bit information represent the first address, and
   wherein the common bit information and the second bit information represent the second address.

8. The memory device of claim 4, wherein the first bit information, the second bit information, and the common bit information correspond to row addresses.

9. The memory device of claim 4, wherein the first bit information, the second bit information, and the common bit information correspond to column addresses.

10. The memory device of claim 4, wherein the first bit information, the second bit information, and the common bit information are respectively programmed into the first fuse bank, the second fuse bank, and the common fuse bank using at least one of fuses, latches, or anti-fuses.

11. The memory device of claim 2, wherein, when the first determination indicates that the memory cell address matches the first address, the first match sub-circuit outputs a first repair signal, and
    wherein, when the second determination indicates that the memory cell address matches the second address, the second match sub-circuit outputs a second repair signal.

12. The memory device of claim 11, wherein the memory device is configured to direct memory operations corresponding to the memory cell to a first redundant memory cell of the memory cell array instead of the first defective memory cell based on the first repair signal and/or to direct the memory operations corresponding to the memory cell to a second redundant cell of the memory cell array instead of the second defective memory cell based on the second repair signal.

13. The memory device of claim 5, wherein the bit compare circuit includes XNOR gates, and
wherein the common bit-by-bit results, the first bit-by-bit results, and the second bit-by-bit results are based on comparisons using the XNOR gates.

14. The memory device of claim 1, wherein the shared common bit-processing circuit includes NAND gates that receive and compare the common bit-by-bit results.

15. A method, comprising:
storing common bit information corresponding to a first defective memory cell of a memory array and a second defective memory cell of the memory array;
providing a first determination of whether a memory cell address used for memory operations on a memory cell of the memory array corresponds to a first address of the first defective memory cell;
providing a second determination of whether the memory cell address corresponds to a second address of the second defective memory cell;
receiving common bit-by-bit results based on a comparison between a portion of the memory cell address and the common bit information; and
determining whether the common bit information matches the portion of the memory cell address.

16. The method of claim 15, wherein the common bit information corresponds to X least significant bits (LSBs) of the first address and the second address, where X is an integer greater than zero and less than a total number of address bits of the first defective memory cell or the second defective memory cell.

17. The method of claim 15, further comprising:
storing first bit information corresponding to the first defective memory cell in a first fuse bank;
storing second bit information corresponding to the second defective memory cell in a second fuse bank;
generating the common bit-by-bit results;
generating first bit-by-bit results based on a comparison between a first portion of the memory cell address and the first bit information; and
generating second bit-by-bit results based on a comparison between the first portion of the memory cell address and the second bit information.

18. The method of claim 15, further comprising:
providing a first repair signal when the first determination indicates that the memory cell address matches the first address, the first repair signal to direct the memory operations corresponding to the memory cell to a first redundant memory cell of the memory cell array instead of the first defective memory cell; and
providing a second repair signal when the second determination indicates that the memory cell address matches the second address, the second repair signal to direct the memory operations corresponding to the memory cell to a second redundant memory cell of the memory cell array instead of the second defective memory cell.

19. A memory device, comprising:
a memory array including a plurality of memory cells;
a set of fuse banks including a first fuse bank corresponding to a first defective memory cell, a second fuse bank corresponding to a second defective memory cell, and a third fuse bank corresponding to both the first defective memory cell and the second defective memory cell; and
a repair circuit operatively coupled to the memory array and the set of fuse banks and configured to generate bit-by-bit results of comparisons between at least a portion of an address for memory operations and bit information stored in at least one of the first fuse bank, the second fuse bank, or the third fuse bank, the repair circuit including a first match sub-circuit to provide a first determination of whether the address for memory operations corresponds to the first defective memory cell based on a first portion of the bit-by-bit results and a second match sub-circuit to provide a second determination of whether the address for memory operations corresponds to the second defective memory cell based on a second portion of the bit-by-bit results, the first portion of the bit-by-bit results and the second portion of the bit-by-bit results including bit-by-bit results that are common to both the first portion and the second portion,
wherein the first match sub-circuit and the second match sub-circuit include a common sub-circuit that is configured to receive and compare the common bit-by-bit results, the common bit-by-bit results corresponding to the third fuse bank.

20. The memory device of claim 19, wherein each of the first fuse bank and the third fuse bank stores a portion of an address corresponding to the first defective memory cell of the plurality of memory cells, and
wherein each of the second fuse bank and the third fuse bank stores a portion of an address corresponding to a second defective memory cell of the plurality of memory cells.

* * * * *